United States Patent
Avanzino et al.

(10) Patent No.: US 6,530,997 B1
(45) Date of Patent: Mar. 11, 2003

(54) USE OF GASEOUS SILICON HYDRIDES AS A REDUCING AGENT TO REMOVE RE-SPUTTERED SILICON OXIDE

(75) Inventors: Steven C. Avanzino, Cupertino, CA (US); Larry Yu Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/543,484

(22) Filed: Apr. 6, 2000

(51) Int. Cl.[7] .................................................. B08B 7/04
(52) U.S. Cl. ........................ 134/30; 134/1.3; 134/2; 134/19; 134/26
(58) Field of Search .......................... 134/1, 1.1, 1.2, 134/1.3, 2, 19, 26, 30

(56) References Cited

U.S. PATENT DOCUMENTS 5,089,441 A * 2/1992 Moslehi .......................... 134/1
5,403,434 A * 4/1995 Moslehi .......................... 134/1
6,033,996 A * 3/2000 Rath et al. .................... 134/1.3

* cited by examiner

*Primary Examiner*—Alexander Markoff
(74) *Attorney, Agent, or Firm*—Foley & Lardner

(57) ABSTRACT

A method and article of manufacture of a semiconductor device having a cleaned source/drain surface and substantially uniform cobalt silicide deposited thereon. The method of the invention includes a precursor conventional step of an argon ion pre-sputter step which generally cleans the semiconductor device surfaces but ensures a resputtering of $SiO_2$ to form $SiO_x$ species deposits on the source/drain surface of the device. An in situ treatment using silicon hydride species causes reduction of the $SiO_x$ species leaving a cleaned residual silicon which can accept a cobalt deposition to form a desired cobalt silicide layer on the source/drain surface.

20 Claims, 1 Drawing Sheet

USE OF GASEOUS SILICON HYDRIDES AS A REDUCING AGENT TO REMOVE RE-SPUTTERED SILICON OXIDE

TECHNICAL FIELD

This invention is related to a semiconductor article and a method for processing of semiconductor devices. In particular, the invention is directed to an improved method for cleaning unwanted sputter deposits from source/drain surfaces. Further, the invention is particularly directed to performing an in situ cleaning process to remove re-sputtered $SiO_x$ deposited on the source/drain surface in a semiconductor device.

BACKGROUND OF THE INVENTION

During manufacture of a semiconductor device, it is necessary to clean selected surfaces of the device before sputter deposition of a metal, such as cobalt which is intended to form a cobalt silicide as part of the final device structure. During such a prior art process, as shown in FIG. 1, the argon ions 10 tend to sputter $SiO_x$ species 12 from the $SiO_2$ spacer material 14 which deposits on other surfaces, such as source/drain surfaces 16. As a result, the contaminating $SiO_x$ species 12 on the source/drain surfaces 16 prevent deposition of cobalt onto silicon to form the desired cobalt silicide layer. The resulting CoSi layer is therefore spotty and potentially discontinuous which can result in degraded performance of a semiconductor device 18. It is therefore important to develop a process to prevent re-sputtered $SiO_2$ from depositing on the source/drain surfaces 16.

SUMMARY OF THE INVENTION

According to one form of the invention, a semiconductor device is prepared for deposition of a cobalt silicide onto a source/drain region. The device undergoes a first standard sputter pre-clean using an inert gas ion, such as argon. After this sputter pre-clean step, the device surfaces are further cleaned by use of a mixture of silicon hydride, or silanes, and hydrogen ($H_2$). In the most preferred form, $H_2$ is used with $SiH_4$ to assure no deposition of Si. These silicon hydrides can be activated by RF plasma or by an elevated wafer temperature to form $SiH_2$ and $SiH_3$ species. These silane derivatives are applied in situ to the semiconductor device, particularly to source/drain surfaces which are to be cleaned in preparation for formation of a cobalt silicide layer. The silane derivatives act to convert to elemental Si the contaminating $SiO_x$ deposits formed from the argon pre-sputter of the $SiO_2$ spacer material present in the semiconductor device.

These and other objects, features and advantages of the invention will be apparent from the following description of the preferred embodiments and examples, taken in conjunction with the accompanying drawings described below.

DETAILED DESCRIPTION OF PREFERRED EMBODIMENTS

Figure 1:
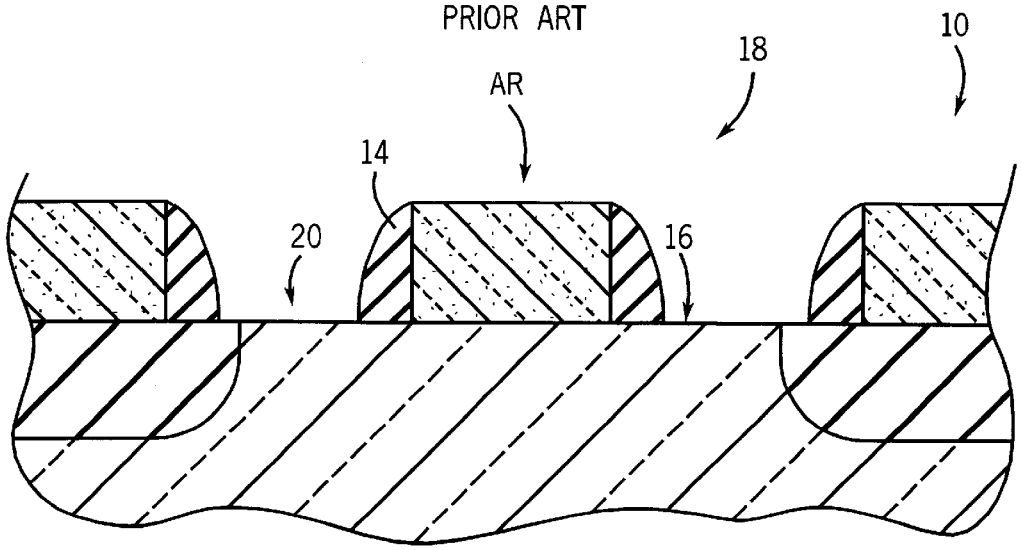
FIG. 1 shows a standard prior art method of a sputter pre-cleaning of a semiconductor device having a source/drain surface.
Figure 2:
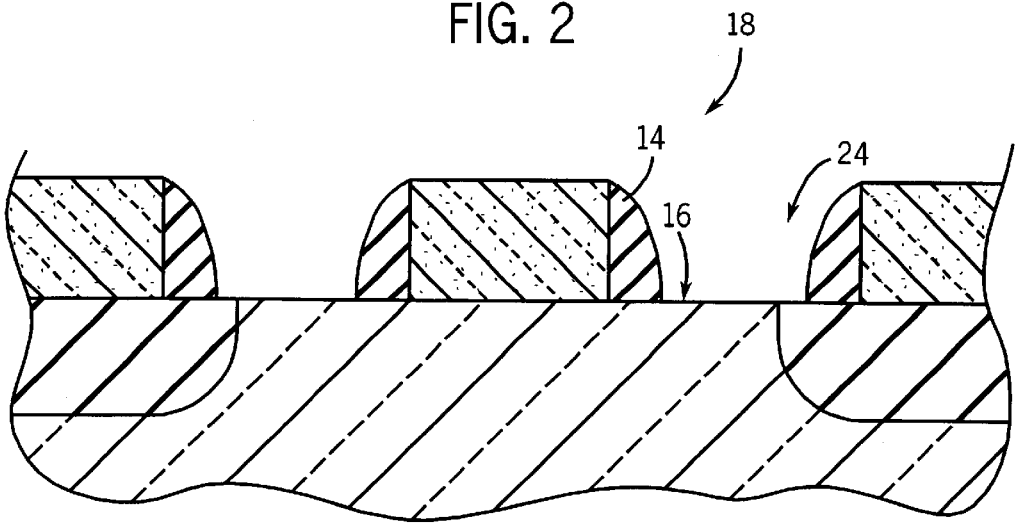
FIG. 2 shows a process of the invention for further cleaning of contaminants left by the process of FIG. 1.

FIG. 2 illustrates schematically a preferred embodiment of a method of the invention. This method is preceded by conventional sputter etch pre-cleaning of a semiconductor device 18 in the manner shown schematically in FIG. 1. This device 18 includes a source/drain surface 16 and a $SiO_x$ spacer material 14 is impacted by an argon ion beam 10 which causes sputtering of $SiO_x$ species 20 onto the device 18, including the source/drain surface 16. The $SiO_x$ species 20 form at least islands of deposited material (and potentially a continuous film) and prevents deposition of cobalt, or other desired species, onto the silicon. In processing the preferred form of the semiconductor device 18, the ultimate purpose of the cobalt deposition is to form a thin, uniform silicide layer. However, re-sputtered $SiO_x$ deposits onto the source/drain surface 16, preventing formation of the desired cobalt silicide and can substantially impair performance of the semiconductor device 18.

The resulting unwanted deposits of the $SiO_x$ species 20 can be removed by the process of in situ reduction of the deposited $SiO_x$ by introducing silane species, such as $SiH_4$ and $Si_2H_6$, for example, mixed with $H_2$. The step is performed in situ causing reduction of $SiO_x$ to such gaseous species as $H_2O$ and $SiH_4$ and $H_2$ and leave a deposited Si on the silicon-based source/drain surface 16. The cleaned form of the surface 16 is then subject to deposition of Co atoms 24 on the source/drain surface 16 to form a desired cobalt silicide layer 22.

This reduction process for removal of the unwanted $SiO_x$ 12 is also performed at temperatures and pressures which are low enough to prevent chemical vapor deposition of silicon from the presence of silane species mixed with $H_2$. In a most preferred embodiment, the temperature of the source/drain surface 16 is about 500°–550° C. In another form of the invention, the source/drain surface can be about 200° C., and even less, provided an RF plasma can be formed in situ to activate the silane species. The activated silane species of the desired molecular state include forming activated $SiH_2$ and $SiH_3$ species to carry out the reduction of the $SiO_x$ which have been deposited on the surface 16.

As a result of the above-described preferred processing methods, an article of manufacture is produced which embodies a superior structure for the semiconductor device 18. The device 18 as processed hereinbefore provides the desired substantially continuous, uniform cobalt silicide layer on the source/drain surface 16, thereby resulting in enhanced performance and reliability of the semiconductor device 18.

In the most preferred embodiment, the reaction chemistry is thermodynamically favorable when the sputtered contaminant is analogous to SiO. If the contaminant is $SiO_2$, the thermodynamics predicts the reduction reaction by $SiH_4$ or $H_2$ will not occur. The exact chemical composition of the $SiO_x$ is likely not to be stoichiometric $SiO_2$, considering that it is formed by the redeposition of sputtered Si and O atoms.

The following non-limiting example illustrates an embodiment of the method and article of manufacture of the invention.

Example

In an intermediate step in the manufacture of integrated circuits, semiconductor wafers with exposed source/drain silicon surfaces are processed in a conventional, well-known UHV metal sputtering system with a layer of sputter-deposited cobalt. In carrying out this process step, wafers pass through a load-lock into the sputter-deposition chamber. The wafer is then sputter-etch cleaned for ~10 sec in an argon plasma generated using 150–400 W of RF power with DC bias and an Ar flow of 5 sccm. During this step some unwanted $SiO_x$ is sputter-deposited onto the clean silicon surface. After the sputter-etch step, the wafer is heated to between 400–550 C and a mixture of $SiH_4$ and $H_2$ (1:1) gases are passed over the wafer's surface for 60 sec to reduce the $SiO_x$ to elemental silicon. Alternatively, the wafer can be heated to ~200 C, and while the $SiH_4$ and $H_2$ mixture is present, a low power RF plasma can be produced to activate the gaseous reducing agents. After the chamber has been evacuated of reactant gases, the Co metal is sputter-deposited onto the wafer by an argon RF plasma using from between 600–100 W. The final Co thickness is between 50–250 A deposited onto a $SiO_x$ free source/drain surface. The wafer is removed from the sputter chamber for subsequent process steps.

These and other objects, features and advantages of the invention will be apparent from the following description of the preferred embodiments and examples, taken in conjunction with the accompanying drawings described below.

What is claimed is:

1. A method of cleaning a semiconductor device surface, comprising the steps of:
   performing a pre-cleaning step of a semiconductor layer using ion sputtering; and
   establishing a partial pressure of silicon hydride species and $H_2$ in situ above said semiconductor layer; and
   establishing a temperature of said semiconductor layer at 200° C. or less if the silicon hydride species are activated by a plasma or at 400–550° C. to enable reduction of $SiO_x$ species re-sputtered by the step of pre-cleaning the semiconductor layer, the reduction of the $SiO_x$ species leaving a reduced silicon deposit on said semiconductor layer, wherein the $SiO_x$ species is not $SiO_2$.

2. The method as defined in claim 1 wherein said semiconductor layer comprises a source/drain layer.

3. The method as defined in claim 1 wherein the ion sputtering step comprises inert gas ion sputtering.

4. The method as defined in claim 1 wherein the partial pressure of the silicon hydride species is about 10–100 m Torr.

5. The method as defined in claim 2 wherein said source/drain layer is maintained during the cleaning at a temperature of about 400–550° C.

6. The method as defined in claim 1 wherein said silicon hydride species are activated by the step of establishing an RF plasma.

7. The method as defined in claim 6 wherein said source/drain layer is maintained during the cleaning at a temperature of less than 200° C.

8. The method as defined in claim 6 wherein the step of activation of said silicon hydride species includes forming $SiH_2$ and $SiH_3$ species.

9. The method as defined in claim 1 wherein said silicon hydride species is selected from the group consisting of $SiH_2$, $SiH_3$, $SiH_4$ and $Si_2H_6$.

10. A method of cleaning a semiconductor source/drain device surface, comprising the steps of:
    performing a pre-cleaning step on a source/drain layer surface of said semiconductor device, leaving $SiO_x$ species deposited on said source/drain layer surface; and
    establishing a partial pressure of silicon hydride species and $H_2$ in situ above said source/drain layer at 200° C. or less if the silicon hydride species are activated by a Plasma or at 400–550° C. to enable reduction of the $SiO_x$ species leaving a reduced silicon layer on said source/drain layer surface and volatizing $H_2O$, wherein the $SiO_x$ species is not $SiO_2$.

11. The method as defined in claim 10 wherein the pre-cleaning step includes sputter cleaning.

12. The method as defined in claim 10 wherein said silicon hydride species are selected form the group consisting of $SiH_2$, $SiH_3$, $SIH_4$ and $Si_2H_6$.

13. The method as defined in claim 10 wherein said source/drain layer surface is maintained during the cleaning at a temperature of about 400–550° C.

14. The method as defined in claim 10 further including the step of activating said silicon hydride species by forming an RF plasma.

15. The method as defined in claim 14 wherein said source/drain layer surface is maintained below at a temperature below about 200° C.

16. A method of cleaning a semiconductor device surface, comprising the steps of:
    performing a pre-cleaning step of semiconductor layer using ion sputtering; and
    providing silicon hydride species and $H_2$ in situ above said semiconductor layer at 200° C. or less if the silicon hydride species are activated by a plasma or at 400–550° C. to enable reduction of the $SiO_x$ species re-sputtered by step of pre-cleaning the layer, reduction of the $SiO_x$ species leaving a reduced silicon deposit on said semiconductor layer, wherein the $SiO_x$ species is not $SiO_2$.

17. The method as defined in claim 16 wherein said semiconductor layer comprises a source/drain layer.

18. The method as defined in claim 17 wherein the ion sputtering step comprises inert gas ion sputtering.

19. The method as defined in claim 18 wherein the silicon hydride species is at a partial pressure of about 10–100 m Torr.

20. The method as defined in claim 19 wherein said silicon hydride species is selected from the group consisting of $SiH_2$, $SiH_3$, $SiH_4$ and $Si_2H_6$.

* * * * *